(12) United States Patent
Lee

(10) Patent No.: US 8,058,129 B2
(45) Date of Patent: Nov. 15, 2011

(54) LATERAL DOUBLE DIFFUSED MOS DEVICE AND METHOD FOR MANUFACTURING THE SAME

(75) Inventor: Yong-Jun Lee, Yeonsu-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/615,096

(22) Filed: Nov. 9, 2009

(65) Prior Publication Data

US 2010/0123195 A1    May 20, 2010

(51) Int. Cl.
*H01L 21/336* (2006.01)
(52) U.S. Cl. .................... 438/286; 438/291; 438/297
(58) Field of Classification Search .................. 438/286, 438/291, 297
See application file for complete search history.

(56) References Cited

U.S. PATENT DOCUMENTS

| 5,306,652 | A  | * | 4/1994  | Kwon et al. | .............. | 438/283 |
| 6,483,149 | B1 | * | 11/2002 | Mosher et al. | ............ | 257/356 |

* cited by examiner

*Primary Examiner* — Long Pham
(74) *Attorney, Agent, or Firm* — Sherr & Vaughn, PLLC

(57) ABSTRACT

A lateral double diffused metal oxide semiconductor (LD-MOS) device and a method of manufacturing the same. A LDMOS device may include a high voltage well formed over a substrate, a reduced surface field region formed thereover which may be adjacent a body region, and/or an isolation layer. An isolation layer may include a predetermined area formed over a reduced surface field region, may be partially overlapped with a top surface of a substrate and/or may include an area formed adjacent a high voltage well. A low voltage well may be formed over a substrate. A gate electrode may extend from a predetermined top surface of a body region to a predetermined top surface of an isolation layer. A drain region may be formed over a low voltage well. A source region may be formed over a body region and may have at least a portion formed under a gate electrode.

8 Claims, 5 Drawing Sheets

LATERAL DOUBLE DIFFUSED MOS DEVICE AND METHOD FOR MANUFACTURING THE SAME

The present application claims priority under 35 U.S.C. 119 to Korean Patent Application No. 10-2008-0115090 (filed on Nov. 19, 2008) which is hereby incorporated by reference in its entirety.

BACKGROUND

Embodiments relate to a semiconductor device and a method of manufacturing the same. Some embodiments relate to a lateral double diffused metal oxide semiconductor (LDMOS) device and a method of manufacturing the same.

A MOS Field Effect Transistor (MOSFET) may have relatively high input impedance compared to a bipolar transistor, providing an electrical benefit and/or a relatively simple gate driving circuit. A MOSFET may be a unipolar device having substantially no-time delay which may result from minority carrier storage and/or recombination while being turned off A MOSFET may be applied, for example, to switching mode power supply devices, lamp ballasts and/or motor driving circuits. A DMOSFET (Double Diffused MOSFET) may use planar diffusion technology.

Figure 1:
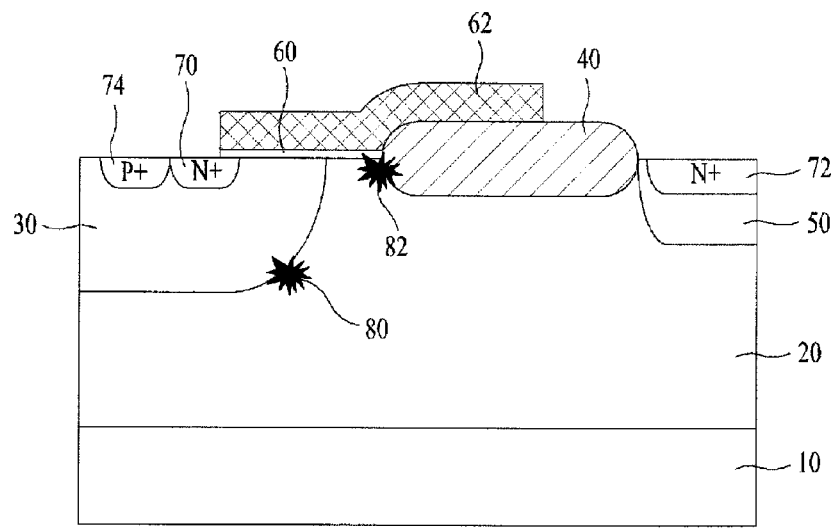

A LDMOS transistor is described in U.S. Pat. No. 4,300, 150 to Colak. A LDMOS device may be applied to a VLSI process due to its relatively simple structure. LDMOS devices may have minimized technical features than, for example, DMOS (VDMOS) devices. However, Reduced Surface Field (RESURF) SLMOS devices may have maximized on-resistance (Rsp). FIG. 1 is a sectional view illustrating a LDMOS device.

Referring to FIG. 1, high voltage well (HVWELL) 20 may be formed on and/or over p-type epilayer 10 which may be formed on and/or over a substrate. P-type body 30 may be formed on and/or over HVWELL 20. P+ region 74 and/or N+ source 70 may be formed on and/or over a surface of p-type body 30. N+ well 50 for Low Voltage (LV) may be formed adjacent isolation layer 40, and/or N+ drain 72 may be formed on and/or over N+ well 50. Gate dielectric layer 60 and/or gate electrode 62 may be partially overlapped with both a top of isolation layer 40 and source 70. Isolation layer 40 may be provided between drain 72 and source 70 to prevent an electric field from being concentrated on and/or over a region near a gate edge in a High Voltage (HV) device capable of outputting higher than approximately 30 V. Gate poly 62 may be lifted to use isolation layer 40 as a plate.

Electric currents may flow along a surface of a LDMOS device, which may minimize electric current driving efficiency. As shown in FIG. 1, when applying a relatively high voltage, an electric field may be concentrated on and/or over a region adjacent to a gate edge. To address electric filed concentration, a region near the gate edge may be corner-rounded but may be limited. As a result, a problematic disadvantage of device reliability and/or deterioration may occur.

Accordingly, there is a need for a LDMOS device and a method of manufacturing a LDMOS device that may minimize on-resistance and/or may acquire a relatively high breakdown voltage.

SUMMARY

Embodiments relate to a lateral double diffused metal oxide semiconductor (LDMOS) device and a method of manufacturing the same. According to embodiments, a LDMOS device and a method of manufacturing the same may minimize on-resistance and/or may acquire a relatively high breakdown voltage.

According to embodiments, a lateral double diffused metal oxide semiconductor (LDMOS) device may include a high voltage well (HVWELL) formed on and/or over a substrate. In embodiments, a LDMOS device may include a reduced surface field (RESURF) region formed on and/or over a HVWELL. In embodiments, a LDMOS device may include a body region formed adjacent to a RESURF region. In embodiments, a LDMOS device may include an isolation layer having a predetermined area formed on and/or over a RESURF region. In embodiments, a isolation layer may partially overlap with a top surface of a substrate.

According to embodiments, a low voltage well (LVWELL) may be formed on and/or over a predetermined area of a substrate, which may be under an area of an isolation layer. In embodiments, a LDMOS device may include a gate electrode which may extend from a predetermined top surface area of a body region to a predetermined top surface of a isolation layer. In embodiments, a LDMOS device may include a drain region formed on and/or over a LVWELL, which may be under an area of an isolation layer. In embodiments, a LDMOS device may include a source region formed on and/or over a body region, which may have at least a portion under a gate electrode.

Embodiments relate to a method of manufacturing a lateral double diffused metal oxide semiconductor (LDMOS) device. According to embodiments, a method of manufacturing a LDMOS device may include forming a high voltage well (HVWELL) on and/or over a substrate. In embodiments, a method of manufacturing a LDMOS device may include forming a RESURF region on and/or over a HVWELL. In embodiments, a method of manufacturing a LDMOS device may include forming a body region adjacent to a predetermined area of a RESURF region. In embodiments, a method of manufacturing a LDMOS device may include forming an isolation layer on and/or over a substrate. In embodiments, an isolation layer may include a predetermined area which may be partially overlapped with an area of a RESURF region.

According to embodiments, a method of manufacturing a LDMOS device may include forming a low voltage well (LVWELL) on and/or over a substrate, which may be under an area of an isolation layer. In embodiments, a method of manufacturing a LDMOS device may include forming a gate electrode which may extend from a predetermined top surface of a isolation layer to a predetermined top surface of a body region. In embodiments, a method of manufacturing a LDMOS device may include forming a drain region on and/or over a LVWELL, which may be under an area of an isolation layer. In embodiments, a method of manufacturing a LDMOS device may include forming a source region on and/or over a body region, which may include at least a portion under a gate electrode.

DRAWINGS

Example FIG. 1 is a sectional view illustrating a LDMOS device.

Figure 2:
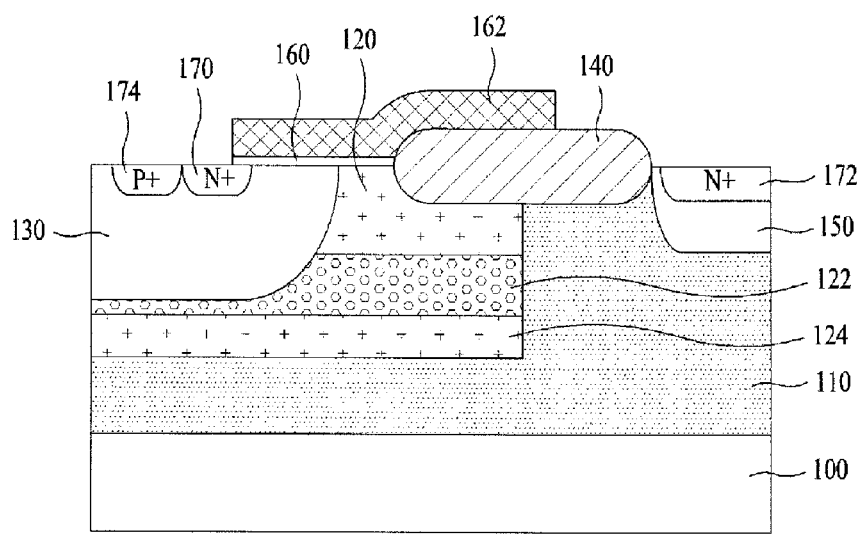

Example FIG. 2 is a sectional view illustrating a LDMOS in accordance with embodiments.

Example FIG. 3A to FIG. 3G are sectional views illustrating a method of manufacturing a LDMOS device in accordance with embodiments.

DESCRIPTION

Embodiments relate to a LDOMS device. According to embodiments, a first conductivity type may be a p-type and a second conductivity type may be an n-type. However, a first conductivity type may be an n-type and a second conductivity type may be a p-type in accordance with embodiments. Referring to example FIG. 2, a sectional view illustrates a LDMOS device in accordance with embodiments.

According to embodiments, p-type epilayer 100 may be formed on and/or over a p-type substrate. In embodiments, n-type high voltage well (HVWELL) 110 may be formed on and/or over p-type epilayer 100. In embodiments, n-type reduced surface field (RESURF) region 120 may be formed on and/or over HVWELL 110. In embodiments, n-type RESURF region 120 may be disposed under isolation layer 140 and/or gate dielectric layer 160. In embodiments, n-type RESURF region 120 may be disposed on and/or over a side of p-type body 130. In embodiments, a depth of n-type RESUF region 120 may be between approximately 1 μl and 1.2 μm.

According to embodiments, a LDMOS device may include p-type first impurity region 122 and/or n-type second impurity region 124. In embodiments, HVWELL 110 and/or p-type first impurity region 122 may be formed under n-type RESURF region 120. In embodiments, n-type second impurity region 124 may be formed under p-type first impurity region 122. In embodiments, unlike a LDMOS device shown in FIG. 1, n-type RESUF region 120, first impurity region 122 and/or second impurity regions 124 may be formed under isolation layer 140 and/or gate dielectric layer 160. In embodiments, a depletion layer may be formed, for example between n-type RESURF region 120 and p-type second impurity region 122, and/or a depletion layer may be formed between p-type first impurity region 122 and n-type second impurity region 124.

According to embodiments, p-type body region 130 may be formed on and/or over a predetermined area between n-type RESURF region 120 and p-type first impurity region 122. In embodiments, isolation layer 140 may include a predetermined area formed on and/or over n-type RESURF region 120, and/or an area formed on and/or over n-type HVWELL 110. In embodiments, isolation layer 140 may include a field oxide layer, for example, silicon oxide that may thermally grow.

According to embodiments, n-type low voltage well (LVWELL) 150 may be formed on and/or over n-type well 110 of a substrate, which may be formed under an area of isolation layer 140 which may be adjacent a high voltage well. In embodiments, a gate pattern may include gate dielectric layer 160 and/or gate electrode 162. In embodiments, gate electrode 162 may extended to a top surface of isolation layer 140 from a top of p-type body region 130. In embodiments, gate electrode 162 may be poly silicon doped with impurity. In embodiments, gate dielectric layer 160 may be formed on and/or over a predetermined area from a top of p-type body region 130 to isolation layer 140, which may be under gate electrode 162.

According to embodiments, high density n-type drain region 172 may be formed on and/or over LVWELL 150, which may be under an area of isolation layer 140. In embodiments, high density n-type source region 170 may be on and/or over an upper area of p-type body region 130, and/or may be adjacent to gate pattern 160 and/or 162. In embodiments, high density p-type region 174 may be a source contact layer to contact source region 170. In embodiments, p-type region 174 may have a maximized contact with respect to p-type body region 130, which may be doped with a higher density than p-type body region 130.

According to embodiments, a predetermined area of p-type body region 130 between n-type source region 170 and n-type RESURF region 120 may be formed under gate dielectric layer 160 and may correspond to a channel area. In embodiments, a predetermined area between p-type body region 130 and n-type LVWELL 150 may be formed under gate dielectric layer 160 and/or isolation layer 140, and may correspond to a drift region.

According to embodiments, a LDMOS device may include n-type RESURF region 120, p-type first impurity region 122 and/or n-type second impurity region 124. In embodiments, other regions illustrated in FIG. 2 may vary and are not limited to a structure illustrated in FIG. 2. In embodiments, a space may be formed on and/or over a side wall of gate pattern 160 and/or 162 illustrated in FIG. 2.

Embodiments relate to a method of manufacturing a LDMOS device. Example FIG. 3A to FIG. 3G are sectional views illustrating a method of manufacturing a LDMOS in accordance with embodiments. Example FIG. 3A to FIG. 3G are sectional views illustrating a process of manufacturing a LDMOS device illustrated in FIG. 2.

Figure 3A:
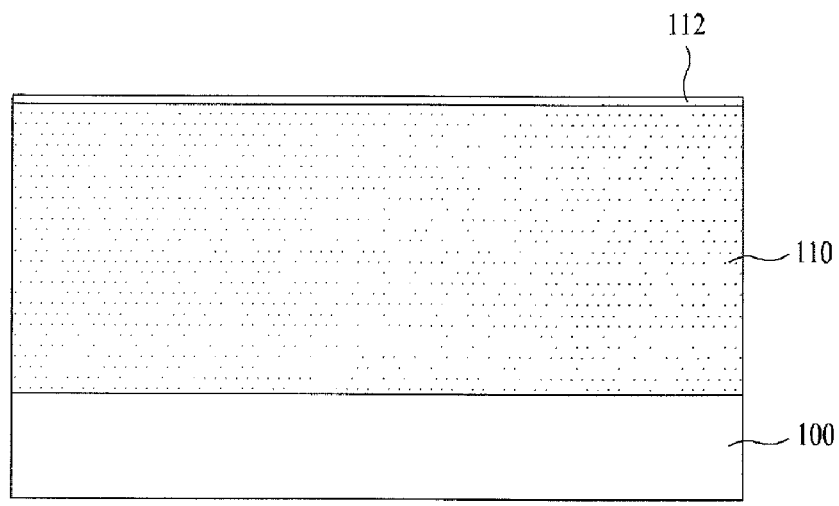

Referring to FIG. 3A, p-type epilayer 100 may be formed on and/or over a substrate. According to embodiments, n-type HVWELL 110 may be formed on and/or over p-type epilayer 100. In embodiments, dielectric layer 112 may include $SiO_2$ for n-type HVWELL 110 which may be formed on and/or over p-type epilayer 100. In embodiments, n-type dopant may be implanted relatively deep with respect to p-type epilayer 100. In embodiments, epilayer 100 may drive-in under a relatively high temperature such that n-type HVWELL 100 may be formed.

Figure 3B:
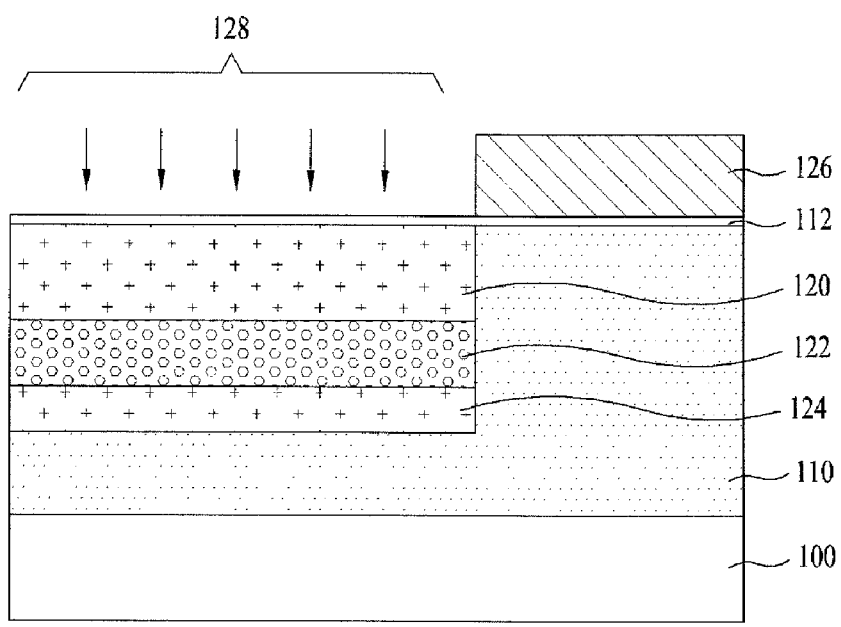

Referring to FIG. 3B, photoresist pattern 126 may, using a photolithography process, expose regions where n-type RESURF region 120, first impurity region 122 and/or second impurity region 124 may be formed. According to embodiments, n-type impurity ion 128 may be implanted using photoresist pattern 126 as ion implantation mask to form n-type RESURF region 120. In embodiments, an impurity ion may be implanted to form n-type RESURF region 120 having a depth between approximately 1 μm and 1.2 μm. In embodiments, p-type impurity ion 128 may be implanted using photoresist pattern 126 as ion-implantation mask to form p-type first impurity region 122, for example under n-type RESURF region 120. In embodiments, n-type impurity ion 128 may be implanted to form n-type second impurity region 124, for example under p-type first impurity region 124.

According to embodiments, using substantially the same photoresist pattern 126 as an ion implantation mask, different ion energies may implanted to form n-type RESURF region 120, p-type first impurity region 122 and/or n-type second impurity region 124. In embodiments, RESURF region 120, first impurity region 122 and/or second impurity region 124 may be formed in various orders. In embodiments, photoresist pattern 126 may be substantially removed, for example in a ashing and/or strip process. In embodiments, ion implantation mask 126 may include a photoresist pattern. In embodiments, other kinds of materials, for example, a hard mask may be used as ion implantation mask.

Figure 3C:
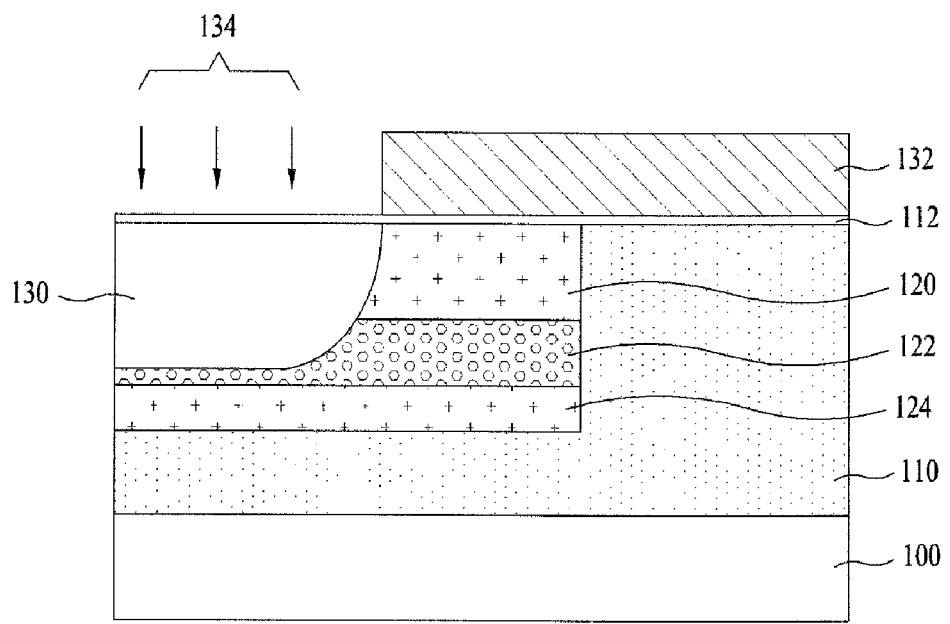

Referring to FIG. 3C, photoresist pattern 132 may expose an area where n-type body region 130 may be formed. According to embodiments, a predetermined area of n-type RESURF region 120 may be formed under dielectric layer 112. In embodiments, p-type impurity ion 134 may be implanted using photoresist pattern 132 as ion implantation mask to form p-type body region 130. In embodiments, photoresist pattern 132 and/or dielectric layer 112 may be substantially removed.

Figure 3D:
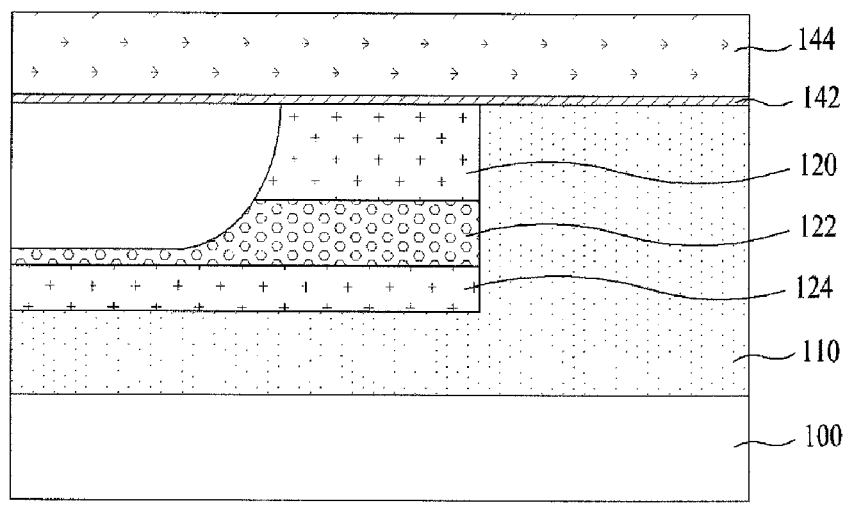
Figure 3E:
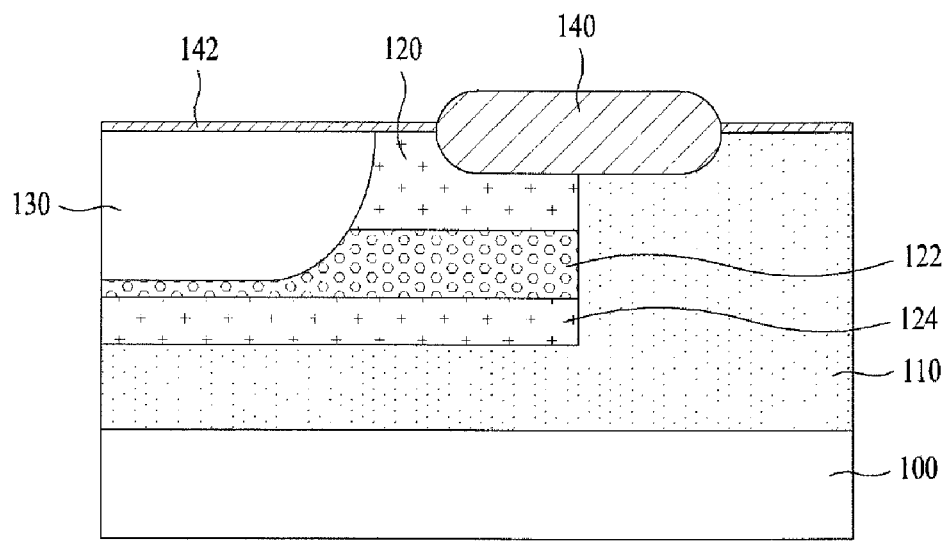

Referring to FIGS. 3D and 3E, isolation layer 140 having an area partially overlapped with an area of n-type RESURF region 130 may be formed on and/or over a substrate. In embodiments, isolation layer 140 may be formed on and/or over both of n-type RESURF region 120 and n-type HVWELL 110. In embodiments, isolation layer 140 may be formed using a Local Oxidation of Silicon (LOCOS) process.

According to embodiments, oxide layer 142, for example $SiO_2$, may be formed on and/or over p-type body region 130, n-type RESURF region 120 and/or n-type HVWELL 100. In embodiments, nitride layers 144, for example $Si_3N_4$, may accumulate sequentially on and/or over oxide layer 142. In embodiments, oxide layer 142 may thermally grow to form isolation layer 140. In embodiments, nitride layer 144 may be substantially removed, for example using a phosphoric acid solution. In embodiments, isolation layer 140 may be formed in a LOCOS process. In embodiments, isolation layer 140 may be formed in a Shallow Trench Isolation (STI) process.

Figure 3F:
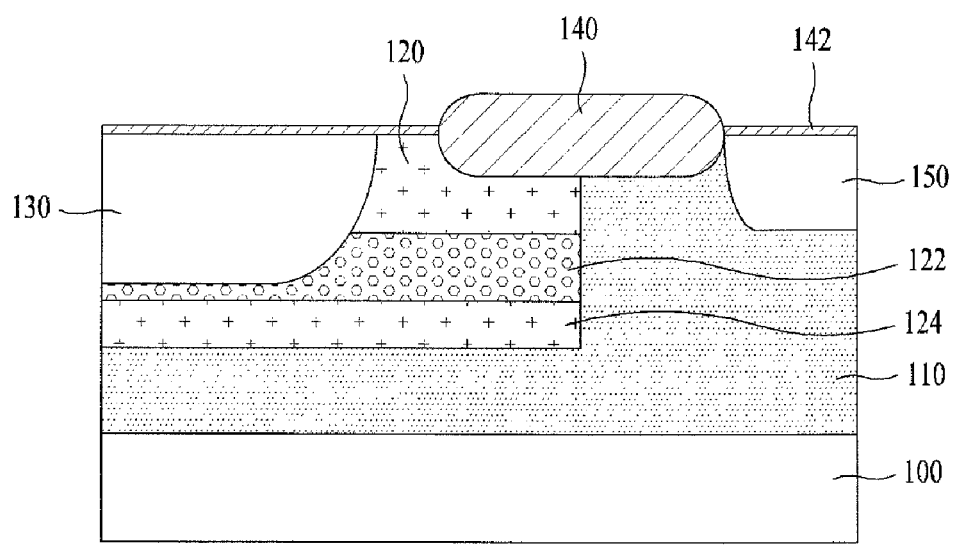
Figure 3G:
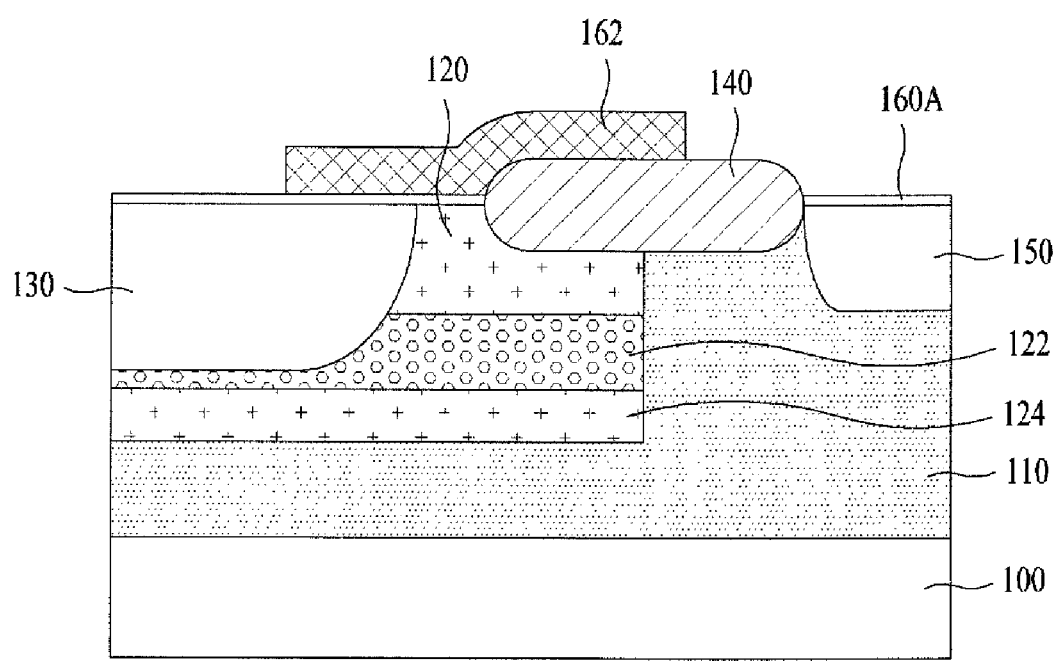

Referring to FIG. 3F, n-type Low Voltage Well (LVWELL) 150 may be formed on and/or over n-type HVWELL 110 of a substrate, which may be under an area of isolation layer 140 which may be adjacent a high voltage well. Referring to FIG. 3G, a gate pattern may include gate dielectric layer 160A, and/or a gate electrode 162 may be formed. According to embodiments, gate electrode 162 may extend to a predetermined top surface area of isolation layer 140 from a predetermined top surface area of p-type body region 130. In embodiments, gate dielectric layer 160A may be formed on and/or over p-type body region 130, n-type RESURF region 120 and/or n-type LVWELL 150. In embodiments, gate dielectric layer 160A may not be formed on and/or over isolation layer 140.

According to embodiments, oxide layer 142 may accumulate sequentially. In embodiments, $SiO_2$ and/or poly silicon may be patterned such that gate dielectric layer 160A and/or gate electrode 162 may be respectively formed, for example as illustrated in FIG. 3G. In embodiments, gate dielectric layer 160A may include Oxide, Nitride and/or compounds thereof, for example accumulating NO and/or ONO layers.

Referring back to FIG. 2, high density n-type source region 170, high density n-type drain region 172 and/or high density p-type region 174 may be formed using an ion implantation process. According to embodiments, high density n-type drain region 172 may be formed on and/or over a surface of the LVWELL 150, which may be under an area of isolation layer 140. In embodiments, high density n-type source region 170 may be formed on and/or over a surface of p-type body region 130 under gate pattern 162. In embodiments, gate dielectric layer 160A may be removed except its area under gate electrode 162. In embodiments, a thermal process may be performed after performing an ion implantation process to form the above-described regions.

According to embodiments, in a LDMOS device and a method of manufacturing a LDMOS device, an n-type RESURF region, p-type first impurity region and/or n-type second impurity region may be formed, for example sequentially, under an isolation layer and/or a gate pattern. In embodiments, a depletion layer may be distributed substantially uniformly on and/or over a surface of a RESURF region. In embodiments, a concentrated electric field of a surface region may be minimized. In embodiments, a surface breakdown in a gate edge of an isolation layer may be minimized, and/or a relatively high voltage breakdown may be maximized. In embodiments, first and/or second impurity regions, and/or a RESURF region, may be formed using a single mask, such that there may be a relatively simple manufacturing process.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
   forming a high voltage well over a substrate;
   forming a reduced surface field region over said high voltage well;
   forming a body region adjacent said reduced surface field region;
   forming an isolation layer over the substrate including a predetermined area partially overlapped with said reduced surface field region;
   forming a low voltage well over the substrate;
   forming a gate electrode extending to a predetermined top surface of said isolation layer from a predetermined top surface of said body region; and
   forming a drain region over said low voltage well;
   forming a source region over said body region having at least a portion under said gate electrode;
   forming a first conductivity type first impurity region under said reduced surface field region; and
   forming a second conductivity type second impurity region under said first conductivity type first impurity region.

2. The method of claim 1, wherein:
   said isolation layer includes an area adjacent said high voltage well; and
   at least a portion of at least one of said low voltage well and said drain region are formed over the substrate and below said area of said isolation layer adjacent said high voltage well.

3. The method of claim 1, wherein forming said first and second impurity regions comprises:
   forming a dielectric layer over said high voltage well;
   forming a photoresist pattern over said dielectric layer; and
   forming said first and second impurity regions by implanting a corresponding impurity ion using said photoresist pattern as ion implantation mask.

4. The method of claim 1, wherein a depth of said reduced surface field region is between approximately 1 µm and 1.2 µm.

5. The method of claim 1, wherein the substrate comprises a first conductivity and said body region is formed over said first conductivity type.

6. The method of claim 5, wherein said first conductivity type comprises a p-type conductivity type.

7. The method of claim 1, wherein at least one of said high voltage well, reduced surface field region, low voltage well, drain region and source region comprise second conductivity-types.

8. The method of claim 7, wherein said second conductivity type comprises a n-conductivity type.

* * * * *